US010418500B2

(12) United States Patent
Suzuki et al.

(10) Patent No.: US 10,418,500 B2
(45) Date of Patent: Sep. 17, 2019

(54) INFRARED DETECTOR, IMAGING DEVICE, AND IMAGING SYSTEM

(71) Applicant: FUJITSU LIMITED, Kawasaki-shi, Kanagawa (JP)

(72) Inventors: Ryo Suzuki, Fujisawa (JP); Junichi Kon, Isehara (JP); Hironori Nishino, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/025,131

(22) Filed: Jul. 2, 2018

(65) Prior Publication Data
US 2019/0019907 A1   Jan. 17, 2019

(30) Foreign Application Priority Data

Jul. 13, 2017   (JP) .................................. 2017-137313

(51) Int. Cl.
*H01L 31/0352* (2006.01)
*H01L 31/0304* (2006.01)
*H01L 27/146* (2006.01)
*H01L 31/109* (2006.01)

(52) U.S. Cl.
CPC ............... *H01L 31/035236* (2013.01); *H01L 27/14652* (2013.01); *H01L 31/0304* (2013.01); *H01L 31/03046* (2013.01); *H01L 31/109* (2013.01)

(58) Field of Classification Search
CPC ....... H01L 31/035236; H01L 27/14652; H01L 31/0304; H01L 31/03046; H01L 31/109
See application file for complete search history.

(56) References Cited

U.S. PATENT DOCUMENTS

| 6,239,449 B1 * | 5/2001 | Fafard ................... B82Y 10/00 257/17 |
| 2010/0032652 A1 | 2/2010 | Okamura et al. |
| 2010/0289061 A1 * | 11/2010 | Matsukura ............. B82Y 20/00 257/189 |
| 2016/0218237 A1 * | 7/2016 | Perera ................... H01L 31/101 |

FOREIGN PATENT DOCUMENTS

| JP | 2009-65141 | 3/2009 |
| JP | 2012-195333 | 10/2012 |
| JP | 2016-136585 | 7/2016 |

* cited by examiner

*Primary Examiner* — Karen Kusumakar
(74) *Attorney, Agent, or Firm* — Fujitsu Patent Center

(57) ABSTRACT

An infrared detector includes a quantum dot structure, and an electrode that is coupled to the quantum dot structure, wherein the quantum dot structure is obtained by stacking a plurality of structures each including a quantum dot, a first barrier layer under the quantum dot and a second barrier layer over the quantum dot to cover the quantum dots, and an intermediate layer under the first barrier layer, and wherein the first barrier layer includes a first region and a second region having a lower Al concentration than that of the intermediate layer between the first region and the intermediate layer.

15 Claims, 12 Drawing Sheets

US 10,418,500 B2

INFRARED DETECTOR, IMAGING DEVICE, AND IMAGING SYSTEM

CROSS-REFERENCE TO RELATED APPLICATION

This application is based upon and claims the benefit of priority of the prior Japanese Patent Application No. 2017-137313, filed on Jul. 13, 2017, the entire contents of which are incorporated herein by reference.

FIELD

The embodiments discussed herein are related to an infrared detector, an imaging device, and an imaging system.

BACKGROUND

Currently, a quantum dot type semiconductor device using quantum dots is actively researched. As one of the quantum dot type semiconductor devices, there is a quantum dot infrared photodetector (QDIP) which is operated by exciting carriers confined in quantum dots when being irradiated with infrared rays so as to be detected as a photoelectric current. Regarding a structure of the QDIP, various researches are conducted.

As an infrared detector which realizes desired long wavelength characteristics and has a low dark current and a high sensitivity, a structure in which an upper part and a lower part of quantum dots are covered with a barrier layer such as AlAs is proposed. However, in this case, impurities are incorporated into the quantum dots due to Al of the barrier layer at the time of forming the quantum dots, and an impurity level is formed in the quantum dots. Therefore, there is a problem in that noise increases and an S/N ratio decreases when detecting infrared rays.

The followings are reference documents.
[Document 1] Japanese Laid-open Patent Publication Nos. 2009-65141,
[Document 2] Japanese Laid-open Patent Publication No 2012-195333, and
[Document 3] Japanese Laid-open Patent Publication No 2016-136585.

SUMMARY

According to an aspect of the invention, an infrared detector includes a quantum dot structure, and an electrode that is coupled to the quantum dot structure, wherein the quantum dot structure is obtained by stacking a plurality of structures each including a quantum dot, a first barrier layer under the quantum dot and a second barrier layer over the quantum dot to cover the quantum dots, and an intermediate layer under the first barrier layer, and wherein the first barrier layer includes a first region and a second region having a lower Al concentration than that of the intermediate layer between the first region and the intermediate layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Hereinafter, a first embodiment will be described. In the embodiment, a quantum dot infrared photodetector (QDIP) is disclosed as an infrared detector, and a configuration thereof will be described with a manufacturing method.

FIGS. 1A to 3B are schematic sectional views illustrating a manufacturing method of the QDIP in order of processes according to the first embodiment.

Each layer of the QDIP is formed by, for example, an epitaxial growth method using a molecular beam epitaxy (MBE). Also, a metal organic chemical vapor deposition (MOCVD) or the like may be also used. Quantum dots of the QDIP are formed by, for example, a self-assembly due to a lattice mismatching.

Figure 1A:
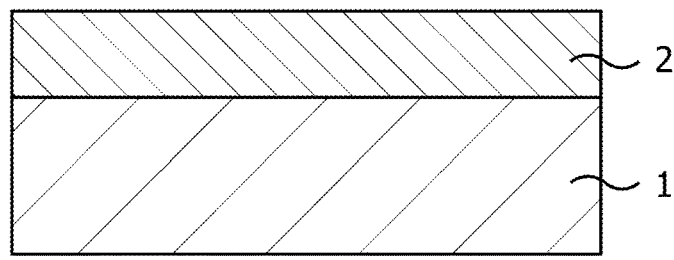
FIGS. 1A to 1C are schematic sectional views illustrating a manufacturing method of a QDIP in order of processes according to a first embodiment.

First, as illustrated in FIG. 1A, a lower contact layer 2 is formed on a GaAs substrate 1.

In detail, for example, the GaAs substrate 1 is prepared as a substrate and is introduced into a loadlock chamber of an MBE. The GaAs substrate 1 is outgassed in a preparation chamber. After that, the GaAs substrate is transferred to a growth chamber which is maintained as an ultrahigh vacuum chamber. The GaAs substrate 1 transferred to the growth chamber is heated under As overpressures in order to remove an oxide film on a surface of the substrate. After the oxide film is removed, in order to improve flatness of the surface of the substrate, for example, a GaAs buffer layer (not illustrated) is grown to, for example, approximately 100 nm at approximately 600° C. of a substrate temperature.

Next, as, for example, 600° C. of the substrate temperature, for example, Si doped n-type GaAs having an electron concentration $1\times10^{18}/cm^3$ is grown to a thickness of approximately 250 nm. Accordingly, the lower contact layer 2 is formed on the GaAs substrate 1. Here, n-type impurities other than Si may be also doped. In addition, a carrier is an electron, but a hole can be also used.

Figure 1B:
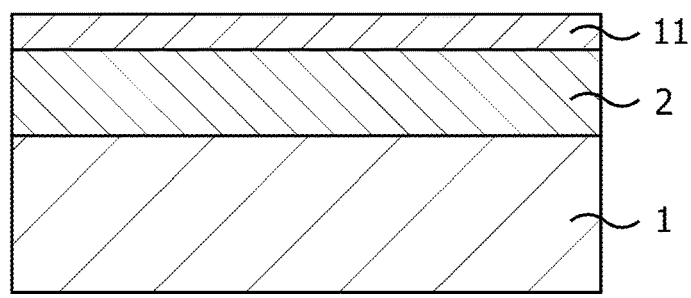

Subsequently, as illustrated in FIG. 1B, an intermediate layer 11 is formed.

In detail, a compound semiconductor material containing Al, for example, $Al_bGa_{1-b}As$ (0≤b<1), specifically, $Al_{0.2}Ga_{0.8}As$ is grown to a thickness of approximately 25 nm. Accordingly, the intermediate layer 11 is formed on the lower contact layer 2.

Figure 1C:
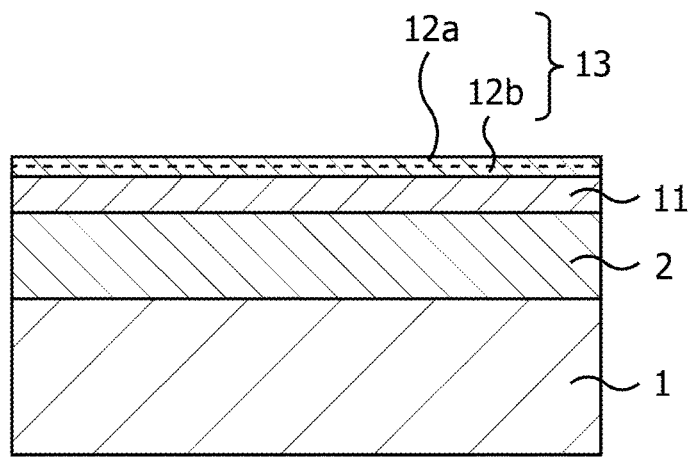

Subsequently, as illustrated in FIG. 1C, a first barrier layer 13 is formed.

In detail, first, a compound semiconductor material having a composition with a lower Al concentration than that of the intermediate layer 11, for example, $Al_aGa_{1-a}As$ in which a<b (0≤a<0.2), here, GaAs not containing Al (a=0) is grown to a thickness of, for example, approximately 0.3 nm, on the intermediate layer 11. Therefore, a second region 12b is formed.

Next, a compound semiconductor material having a composition with a higher Al concentration than that of the intermediate layer 11, for example, $Al_cGa_{1-c}As$ in which b<c (0.2<c≤1), here, AlAs not containing Ga (c=1) is grown to a thickness of, for example, 2 nm or less, here, approximately 0.3 nm, on the second region 12b. Accordingly, a first region 12a is formed. When the first region 12a is formed to a thickness of 2 nm or less, the influence of the incorporation of Al on quantum dots 14 to be described later is lessened.

Accordingly, the first barrier layer 13 including the first region 12a and the second region 12b thereunder is formed on the intermediate layer 11.

In the compound semiconductor material, an energy gap increases (decreases) as an Al concentration in the composition increases (decreases). In the embodiment, the first region 12a has a larger energy gap than that of the intermediate layer 11, and the second region 12b has a smaller energy gap than that of the intermediate layer 11. Because of this configuration, a detection sensitivity of infrared rays of the QDIP is improved.

Figure 2A:
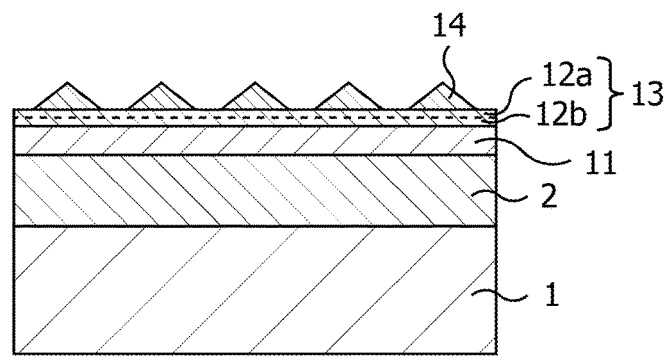
FIGS. 2A to 2C are schematic sectional views illustrating the manufacturing method of the QDIP in order of processes according to the first embodiment following FIGS. 1A to 1C.

Subsequently, as illustrated in FIG. 2A, the quantum dots 14 are formed.

In detail, a substrate temperature is set to, for example, approximately 470° C., and InAs having a thickness thereof corresponding to, for example, a 2 or 3 monolayer is supplied. Here, in the initial stage of InAs supply, InAs grows to be two-dimensionally and forms a wet layer. After that, in the subsequent supply of InAs, InAs three-dimensionally grows in an island shape due to the strain attributed to a difference of a lattice constant between AlAs and InAs, and the quantum dots 14 are self-assembled. These quantum dots 14 have respectively a diameter of approximately 10 nm to 20 nm and a height of approximately 1 nm to 2 nm, and the quantum dots are present approximately $10^{11}$ dots/$cm^2$ in areal density. A part of underlying materials is incorporated into quantum dots. However, since the second region 12b having a lower Al concentration (here, Al is not contained) than that of the intermediate layer 11 is provided between the first region 12a and the intermediate layer 11, a concentration of Al that is incorporated into the quantum dots 14 is suppressed. As a result, an impurity level that is formed in the quantum dots 14 is suppressed.

Figure 2B:
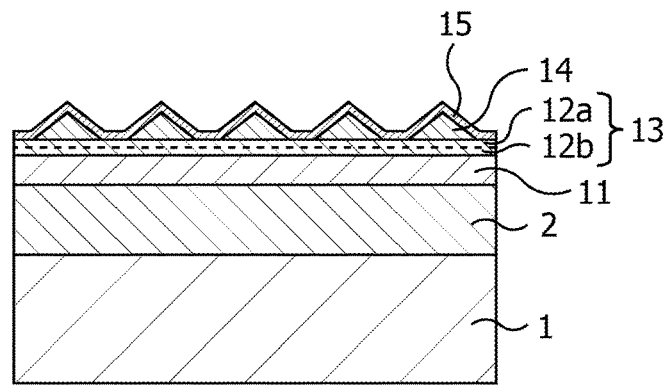
Figure 2C:
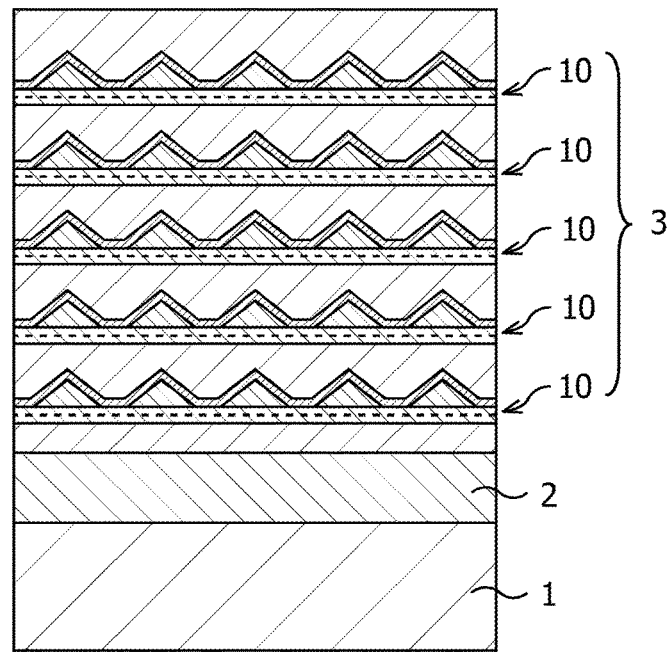

Subsequently, as illustrated in FIG. 2B, a second barrier layer 15 is formed to cover the quantum dots 14.

In detail, in a state where the substrate temperature is maintained at, for example, approximately 470° C., a compound semiconductor material having a composition with a higher Al concentration than that of the intermediate layer 11, for example, $Al_dGa_{1-d}As$ in which b<c (0.2<d≤1), here, AlAs not containing Ga (d=1) is grown to cover the quantum dots 14. Accordingly, the second barrier layer 15 is formed.

As seen from the above, the intermediate layer 11, the second region 12b of the first barrier layer 13, the first region 12a of the first barrier layer 13, the quantum dots 14, and the second barrier layer 15 are sequentially stacked so as to form a structure 10.

Subsequently, a series of processes of FIGS. 1B to 2B is repeatedly performed 10 times to 20 times, for example. Accordingly, as illustrated in FIG. 2C, a quantum dot structure 3 is formed by stacking a plurality of (only five layers are illustrated in illustrated example) the structures 10.

Figure 3A:
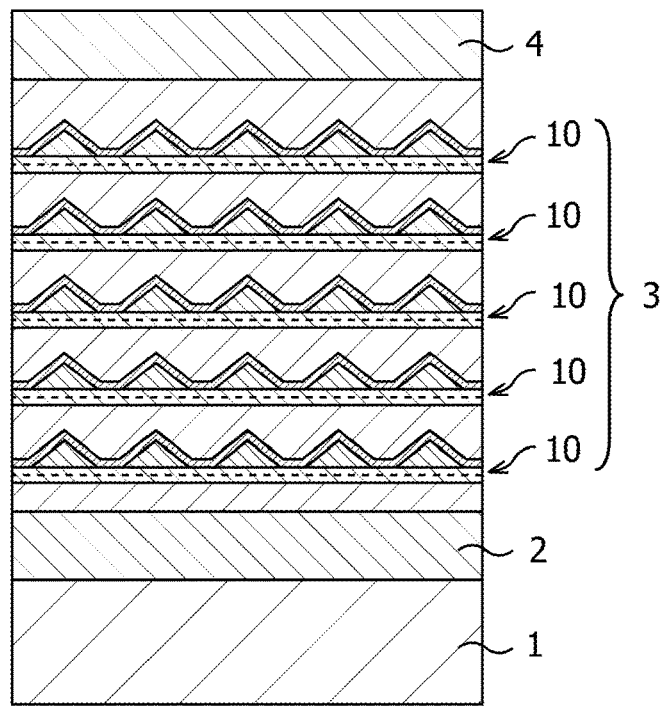
FIGS. 3A and 3B are schematic sectional views illustrating the manufacturing method of the QDIP in order of processes according to the first embodiment following FIGS. 2A to 2C.

Subsequently, as illustrated in FIG. 3A, an upper contact layer 4 is formed on the quantum dot structure 3.

In detail, for example, Si doped n-type GaAs having an electron concentration of $1\times10^{18}/cm^3$ is grown to a thickness of approximately 150 nm. Accordingly, the upper contact layer 4 is formed on the quantum dot structure 3.

Figure 3B:
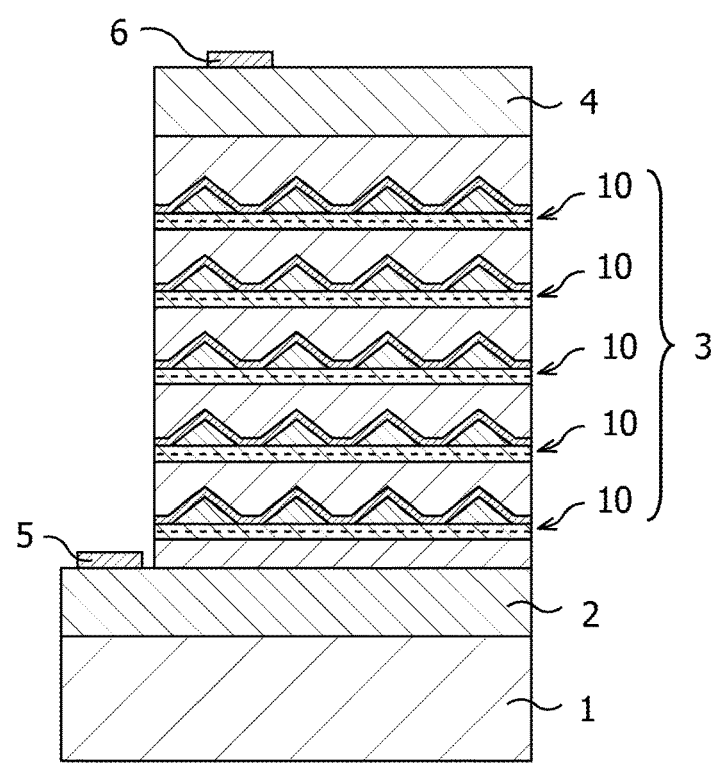

Subsequently, as illustrated in FIG. 3B, a lower electrode 5 and an upper electrode 6 are formed.

In detail, first, an upper electrode is selectively etched using a resist mask or the like until a surface of the lower contact layer 2 is exposed through the upper contact layer 4. Here, a predetermined etching stopper layer is formed between the lower contact layer 2 and the quantum dot structure 3, and the layer may be used as an etching stopper at the time of performing the selective etching described above.

Next, a resist mask including openings through which electrode formation parts are respectively exposed is formed on the lower contact layer 2 and on the upper contact layer 4, and an electrode material such as AuGe/Ni/Au is deposited to fill the respective opening. The resist mask and AuGe/Ni/Au thereon are removed by lift-off. Accordingly, the lower electrode 5 is formed on the lower contact layer 2, and the upper electrode 6 is formed on the upper contact layer 4.

Accordingly, the infrared detector according to the embodiment can be obtained.

Figure 4A:
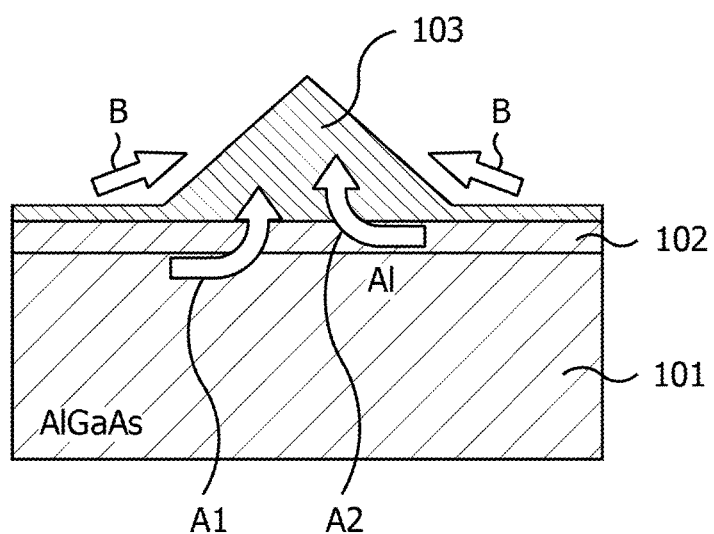
FIGS. 4A and 4B are schematic sectional views for describing incorporation of Al in a forming process of quantum dots.
Figure 4B:
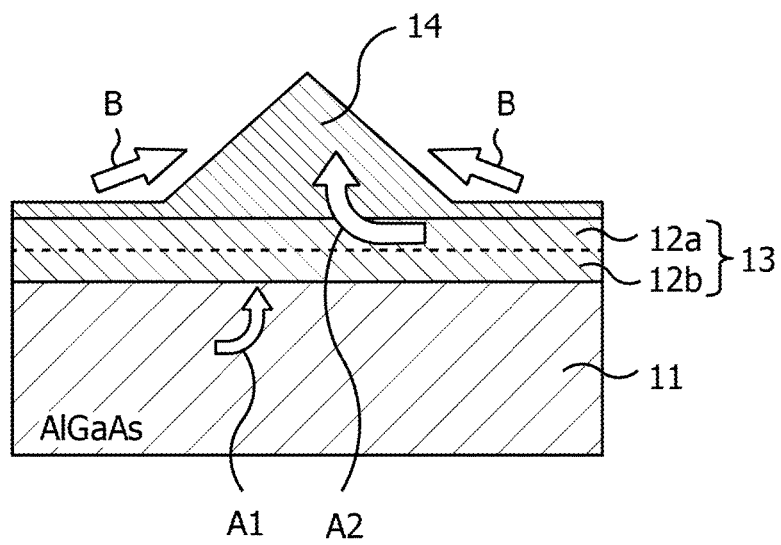
Figure 5:
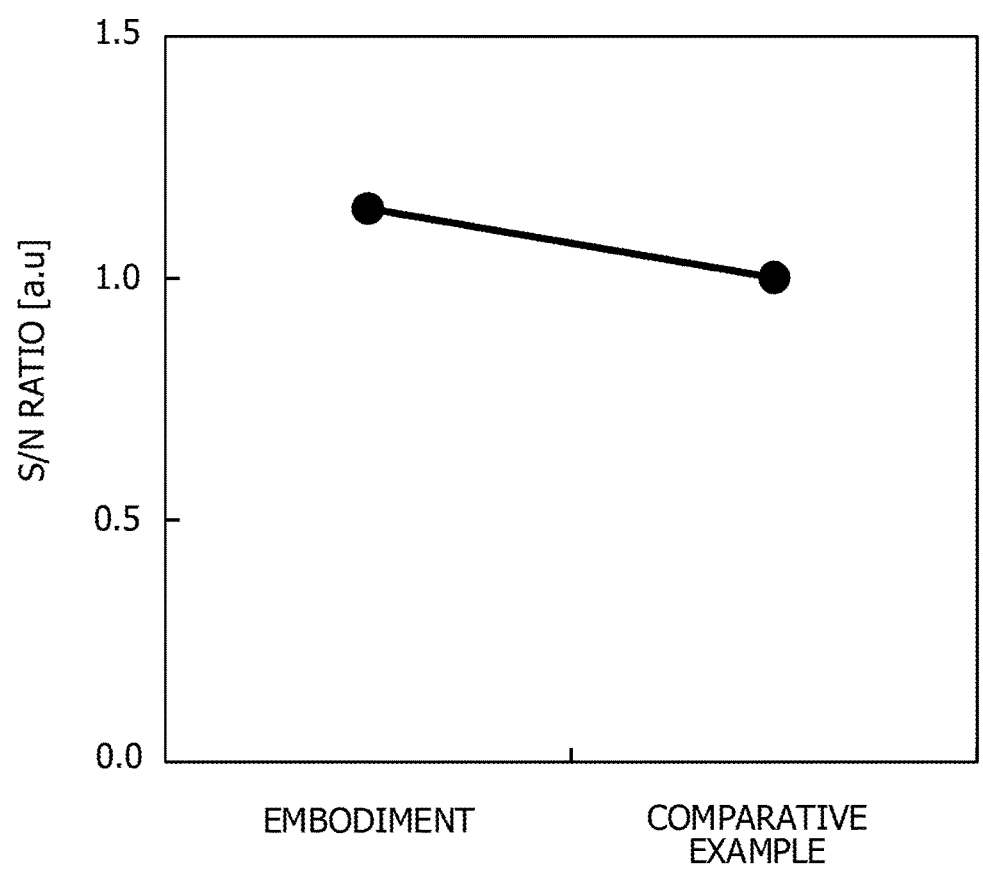
FIG. 5 is a characteristic diagram illustrating S/N ratios of a comparative example and the first embodiment.

Hereinafter, an effect exerted by the infrared detector according to the embodiment will be described based on comparison with a comparative example not including a second region of the first barrier layer. FIGS. 4A and 4B are schematic sectional views for describing only incorporation of Al in a forming process of the quantum dots, FIG. 4A illustrates the comparative example, and FIG. 4B illustrates the embodiment. FIG. 5 is a characteristic diagram illustrating S/N ratios of the comparative example and the embodiment.

In the comparative example, as illustrated in FIG. 4A, a first barrier layer 102 of AlAs is formed on an intermediate layer 101 of AlGaAs, and quantum dots 103 are self-assembled on the first barrier layer 102 in the same manner as the embodiment. The quantum dots 103 are formed by assembling peripheral materials thereof in a winding manner therein as illustrated by an arrow B in the drawing. That is, Al contained in the intermediate layer 101 and the first barrier layer 102 is significantly and chemically active, and as illustrated by arrows Al and A2 in the drawing, impurities such as oxygen are incorporated into the quantum dots 103 with Al. Accordingly, an impurity level is formed in the quantum dots 103. When the impurity level is formed, noise at the time of detecting infrared rays increases, and a S/N ratio is deteriorated.

In the embodiment with respect to that, as illustrated in FIG. 4B, the second region 12b is provided between the intermediate layer 11 and the first region 12a of the first barrier layer 13 as a buffer layer. When the second region 12b having a lower Al concentration than that of the intermediate layer 11 is present, the incorporation of Al to the quantum dots 14 is suppressed, and the impurities are reduced. Accordingly, formation of an impurity level in the quantum dots 14 is suppressed, and as illustrated in FIG. 5, noise at the time of detecting infrared rays is more reduced than that of the comparative example, and the S/N ratio is improved.

As described above, according to the embodiment, a QDIP with high reliability which is capable of reducing noise and improving a S/N ratio is realized.

Second Embodiment

Hereinafter, a second embodiment will be described. In this embodiment, in the same manner as the first embodiment, a QDIP is disclosed as an infrared detector; however, the second embodiment is different in that a composition of the first barrier layer is different from that of the first embodiment.

FIGS. 6A to 7B are schematic sectional views illustrating a main process in order of processes in a manufacturing method of the QDIP in the second embodiment.

First, in the same manner as the first embodiment, various processes of FIGS. 1A and 1B are performed. At this time, the intermediate layer 11 is formed on the lower contact layer 2.

Figure 6A:
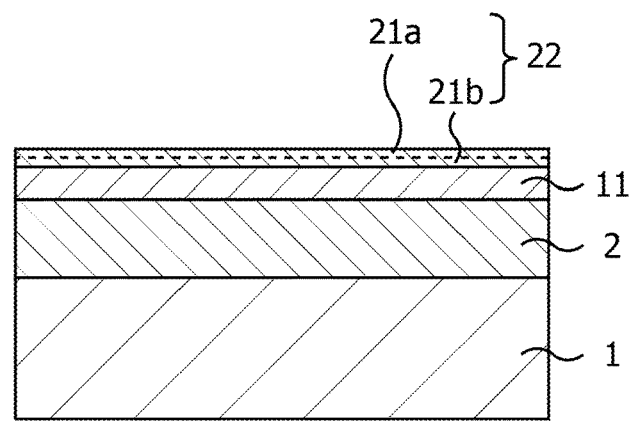
FIGS. 6A to 6C are schematic sectional views illustrating a main process in a manufacturing method of a QDIP in order of processes according to a second embodiment.

Subsequently, as illustrated in FIG. 6A, a first barrier layer 22 is formed.

In detail, first, a compound semiconductor material having a composition with a lower Al concentration than that of the intermediate layer 11, for example, $In_aGa_{1-a}P$ ($0 \leq a \leq 1$) which has a lattice that matches that of GaAs and does not contain Al, here, $In_{0.48}Ga_{0.52}P$ (a=0.48) is grown on the intermediate layer 11 to a thickness of, for example, approximately 0.3 nm. Accordingly, a second region 21b is formed.

Next, a compound semiconductor material having a composition with a higher Al concentration than that of the intermediate layer 11, for example, $Al_cGa_{1-c}As$ in which b<c ($0.2<c \leq 1$), here, AlAs which does not contain Ga (c=1) is grown to a thickness of, for example, approximately 2 nm or less, here, approximately 0.3 nm, on the second region 21b. Accordingly, the first region 21a is formed. When the first region 21a is formed to a thickness of 2 nm or less, an influence of the incorporation of Al on the quantum dots 14 to be described later is lessened.

Accordingly, the first barrier layer 22 including the first region 21a and the second region 21b thereunder is formed on the intermediate layer 11.

In the compound semiconductor material, an energy gap increases (decreases) as an Al concentration in the composition increases (decreases). In the embodiment, the first region 21a has a greater energy gap than that of the intermediate layer 11. Also, the second region 21b has a lower Al concentration than that of the intermediate layer 11. With this configuration, a detection sensitivity of infrared rays of the QDIP is improved.

Figure 6B:
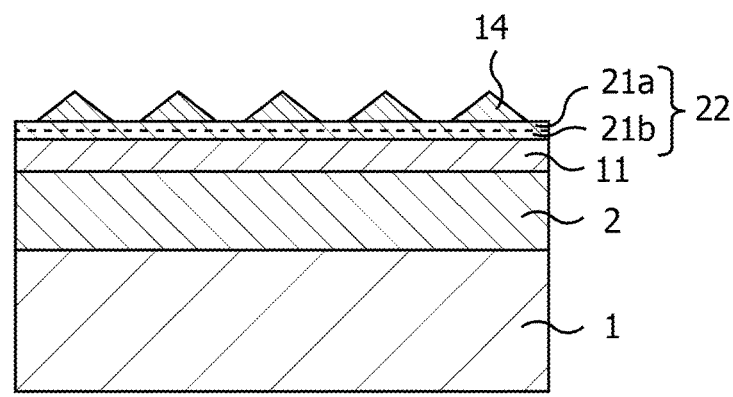

Subsequently, as illustrated in FIG. 6B, the quantum dots 14 are formed.

In detail, a substrate temperature is set to, for example, approximately 470° C., and InAs having a thickness corresponding to a 2 or 3 monolayer is supplied. Here, in the initial stage of InAs supply, InAs grows to be two-dimensionally and forms a wet layer. After that, in the subsequent supply of InAs, InAs three-dimensionally grows in an island shape due to the strain attributed to a difference of a lattice constant between AlAs and InAs, and the quantum dots 14 are self-assembled. These quantum dots 14 have respectively a diameter of approximately 10 nm to 20 nm and a height of approximately 1 nm to 2 nm, and the quantum dots are present approximately $10^{11}$ dots/cm$^2$ in areal density. A part of underlying materials is incorporated into quantum dots. However, since the second region 21b having a lower Al concentration (here, Al is not contained) than that of the intermediate layer 11 is provided between the first region 21a and the intermediate layer 11, a concentration of Al that is incorporated into the quantum dots 14 is suppressed. As a result, an impurity level that is formed in the quantum dots 14 is suppressed.

Figure 6C:
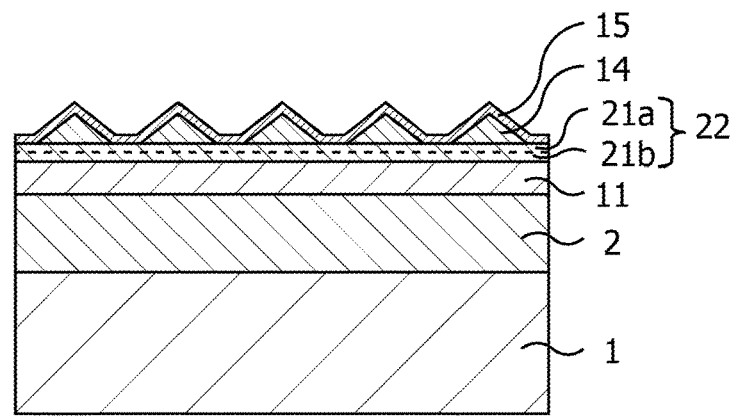

Subsequently, as illustrated in FIG. 6C, the second barrier layer 15 is formed to cover the quantum dots 14.

In detail, in a state where the substrate temperature is maintained at, for example, approximately 470° C., a compound semiconductor material having a composition with a higher Al concentration than that of the intermediate layer 11, for example, $Al_dGa_{1-d}As$ in which b<d ($0.2<d \leq 1$), here, AlAs not containing Ga (d=1) is grown to cover the quantum dots 14. Accordingly, the second barrier layer 15 is formed.

As seen from the above, the intermediate layer 11, the second region 21b of the first barrier layer 22, the first region 21a of the first barrier layer 22, the quantum dots 14, and the second barrier layer 15 are sequentially stacked so as to form a structure 20.

Figure 7A:
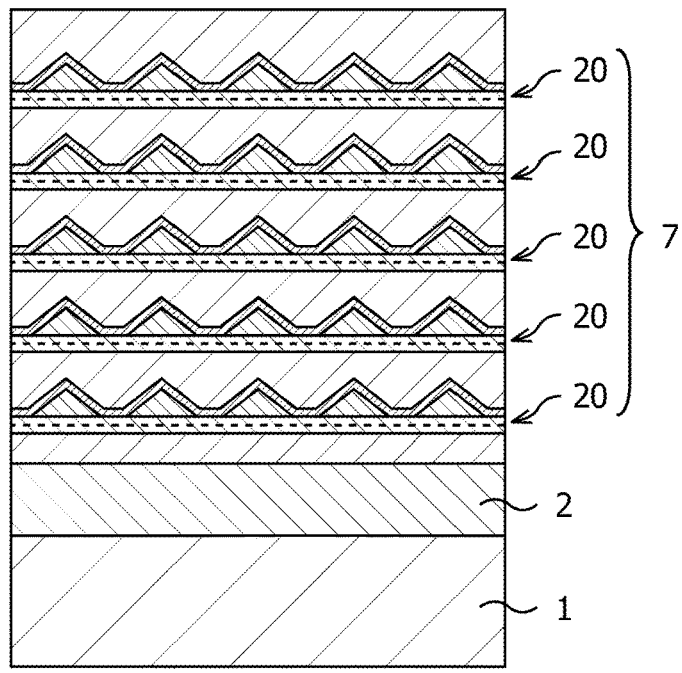
FIGS. 7A and 7B are schematic sectional views illustrating the main process in the manufacturing method of the QDIP in order of processes according to the second embodiment following FIGS. 6A to 6C.

Subsequently, a series of processes of FIGS. 1B and 6A to 6C is repeatedly performed 10 times to 20 times, for example. Accordingly, as illustrated in FIG. 7A, a quantum dot structure 7 is formed by stacking a plurality of (only five layers are illustrated in illustrated example) the structures 20.

Figure 7B:
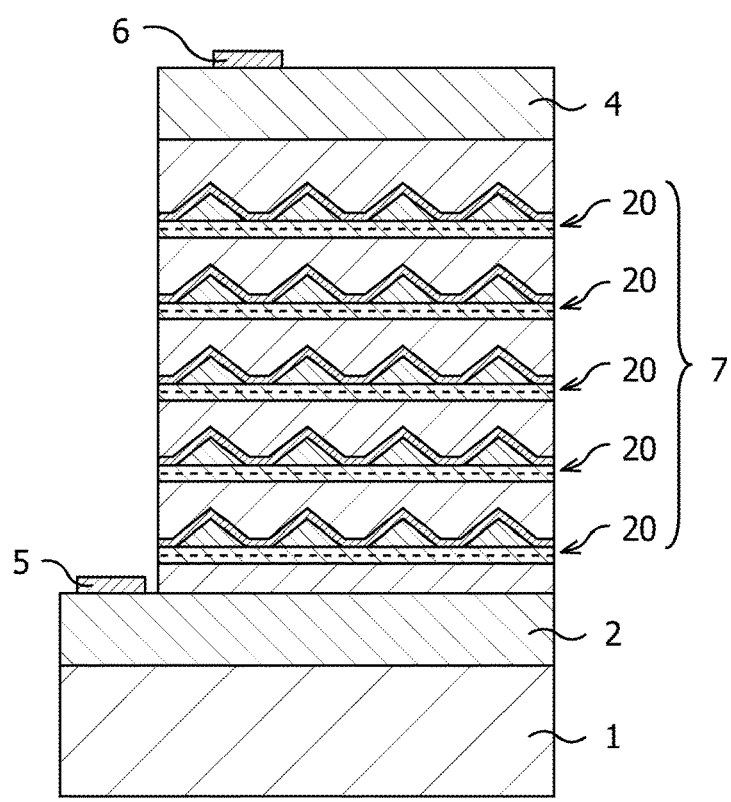

Subsequently, as illustrated in FIG. 7B, the upper contact layer 4, the lower electrode 5, and the upper electrode 6 are formed.

In detail, first, for example, Si doped n-type GaAs having an electron concentration of $1 \times 10^{18}$/cm$^3$ is grown to a thickness of approximately 150 nm. Accordingly, the upper contact layer 4 is formed on the quantum dot structure 7.

Next, an upper electrode is selectively etched using a resist mask or the like until a surface of the lower electrode layer 2 is exposed through the upper contact layer 4. Here, a predetermined etching stopper layer is formed between the lower electrode layer 2 and the quantum dot structure 7, and the layer may be used as an etching stopper at the time of performing the selective etching described above.

Next, a resist mask including openings through which electrode formation parts are respectively exposed is formed on the lower contact layer 2 and on the upper contact layer 4, and an electrode material such as AuGe/Ni/Au is deposited to fill the respective opening. The resist mask and AuGe/Ni/Au thereon are removed by lift-off. Accordingly, the lower electrode 5 is formed on the lower contact layer 2, and the upper electrode 6 is formed on the upper contact layer 4.

Accordingly, the infrared detector according to the embodiment can be obtained.

According to the embodiment, a QDIP with high reliability which is capable of reducing noise and improving a S/N ratio is realized.

Third Embodiment

Hereinafter, a third embodiment will be described. In this embodiment, in the same manner as the first embodiment, a QDIP is disclosed as an infrared detector; however, the third embodiment is different in that a structure of the second barrier layer is different from that of the first embodiment.

Figure 8A:
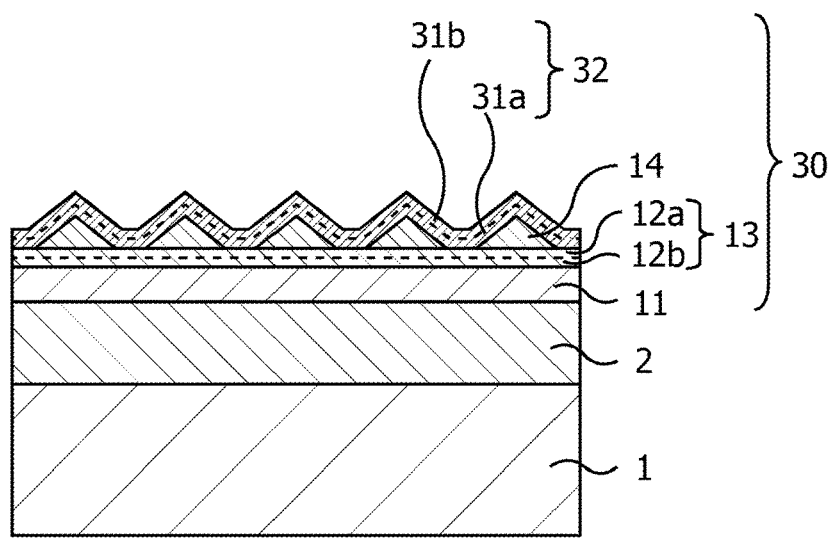
FIGS. 8A and 8B are schematic sectional views illustrating a main process in a manufacturing method of a QDIP in order of processes according to a third embodiment.
Figure 8B:
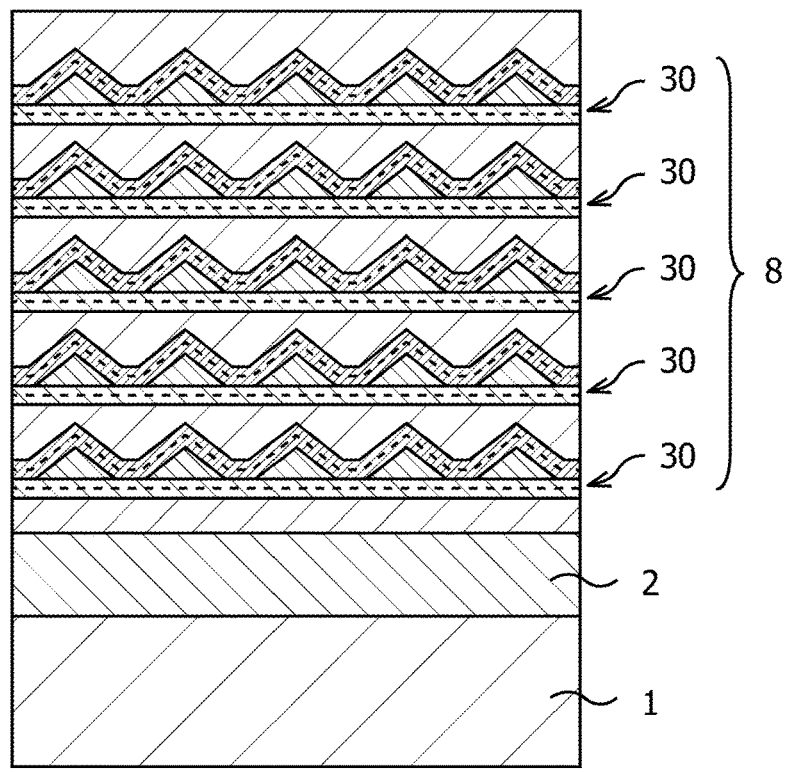
Figure 9:
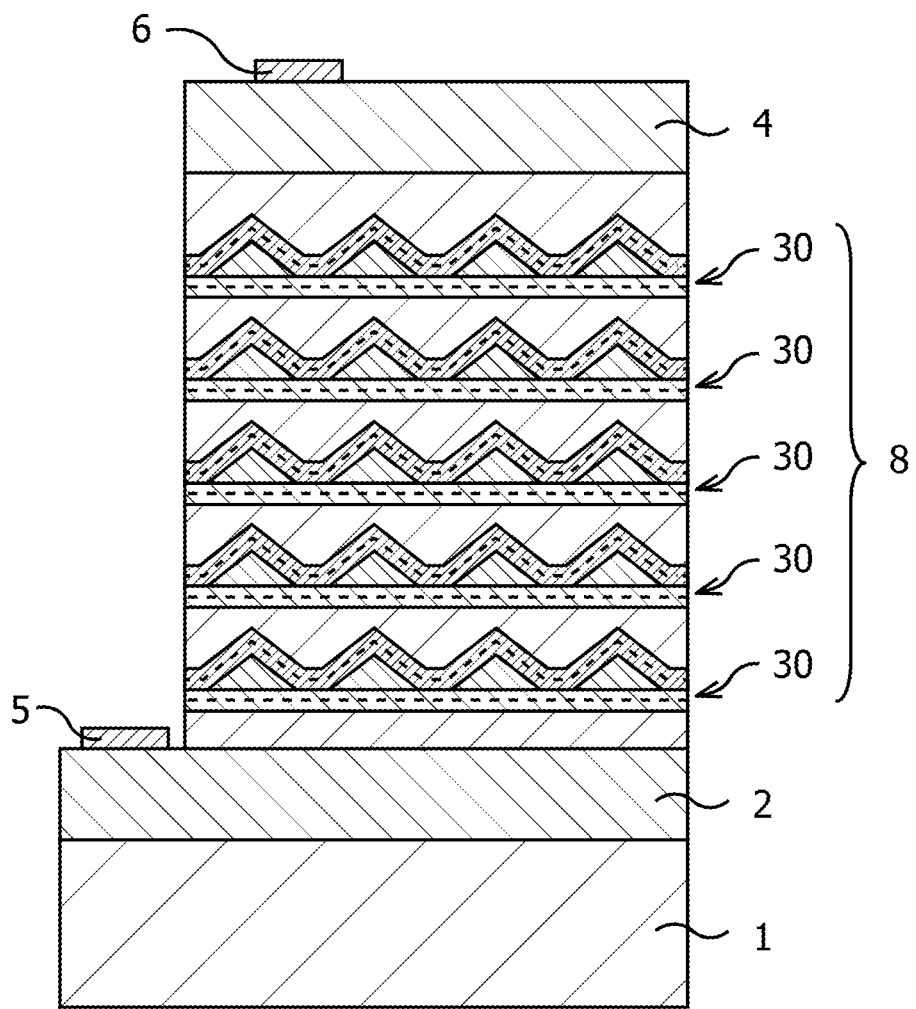
FIG. 9 is a schematic sectional view illustrating the main process in the manufacturing method of the QDIP in order of processes according to the third embodiment following FIGS. 8A and 8B.

FIGS. 8A to 9 are schematic sectional views illustrating a main process in order of processes in a manufacturing method of the QDIP in the third embodiment.

First, in the same manner as the first embodiment, various processes of FIGS. 1A to 2A are performed. At this time, the quantum dots 14 are formed on the first barrier layer 13.

Subsequently, as illustrated in FIG. 8A, a second barrier layer 32 is formed so as to cover the quantum dots 14.

In detail, first, in a state in which the substrate temperature is maintained at, for example, approximately 470° C., a compound semiconductor material having a composition with a higher Al concentration than that of the intermediate layer 11, for example, $Al_dGa_{1-d}As$ in which b<d (0.2<d≤1), here, AlAs not containing Ga (d=1) is grown to cover the quantum dots 14. Accordingly, a third region 31a is formed.

Next, a compound semiconductor material having a composition with a lower Al concentration than that of the intermediate layer 11, for example, $Al_eGa_{1-e}As$ in which e<b (0≤e<0.2), here, GaAs which does not contain Al (e=0) is grown to a thickness of, for example, approximately 0.3 nm on the third region 31a. Accordingly, a fourth region 31b is formed. The third region 31a and the fourth region 31b thereon constitute the second barrier layer 32.

As seen from the above, the intermediate layer 11, the second region 12b of the first barrier layer 13, the first region 12a of the first barrier layer 13, the quantum dots 14, and the third region 31a of the second barrier layer 32, and the fourth region 31b of the second barrier layer 32 are sequentially stacked so as to form a structure 30.

Subsequently, a series of processes of FIG. 1B to FIG. 2A and FIG. 8A is repeatedly performed 10 times to 20 times, for example. Accordingly, as illustrated in FIG. 8B, a quantum dot structure 8 is formed by stacking a plurality of (only five layers are illustrated in illustrated example) the structures 30.

Subsequently, as illustrated in FIG. 9, the upper contact layer 4, the lower electrode 5, and the upper electrode 6 are formed.

In detail, first, for example, Si doped n-type GaAs having an electron concentration of $1 \times 10^{18}/cm^3$ is grown to a thickness of approximately 150 nm. Accordingly, the upper contact layer 4 is formed on the quantum dot structure 8.

Next, an upper electrode is selectively etched using a resist mask or the like until a surface of the lower contact layer 2 is exposed through the upper contact layer 4. Here, a predetermined etching stopper layer is formed between the lower contact layer 2 and the quantum dot structure 8, and the layer may be used as an etching stopper at the time of performing the selective etching described above.

Next, a resist mask including openings through which electrode formation parts are respectively exposed is formed on the lower contact layer 2 and on the upper electrode layer 4, and an electrode material such as AuGe/Ni/Au is deposited to fill the respective opening. The resist mask and AuGe/Ni/Au thereon are removed by lift-off. Accordingly, the lower electrode 5 is formed on the lower contact layer 2, and the upper electrode 6 is formed on the upper contact layer 4.

Accordingly, the infrared detector according to the embodiment can be obtained.

In the embodiment, in addition to the second region 12b of the first barrier layer 13, the fourth region 31b is provided between the third region 31a of the second barrier layer 32 and the intermediate layer 11 thereon as a buffer layer. With this configuration, formation of the impurity level in the quantum dots 14 is further suppressed, noise at the time of detecting infrared rays is reduced, and a S/N ratio is improved.

As described above, according to the embodiment, a QDIP with high reliability which is capable of reducing noise and improving a S/N ratio is realized.

Also, in the third embodiment, the second region 12b of the first barrier layer 13 and the fourth region 31b of the second barrier layer 32 may be formed using InGaP instead of AlGaAs.

In addition, the second region of the first barrier layer in the first to the third embodiments, and the fourth region of the second barrier layer in the third embodiment may be formed using a mixed crystal of one kind or two or more kinds selected from the group consisting of GaAs, InAs, GaSb, InSb, GaP, and InP.

Fourth Embodiment

Hereinafter, a fourth embodiment will be described. In the embodiment, an infrared imaging device including one kind infrared detector selected from the first to the third embodiments is disclosed.

Figure 10:
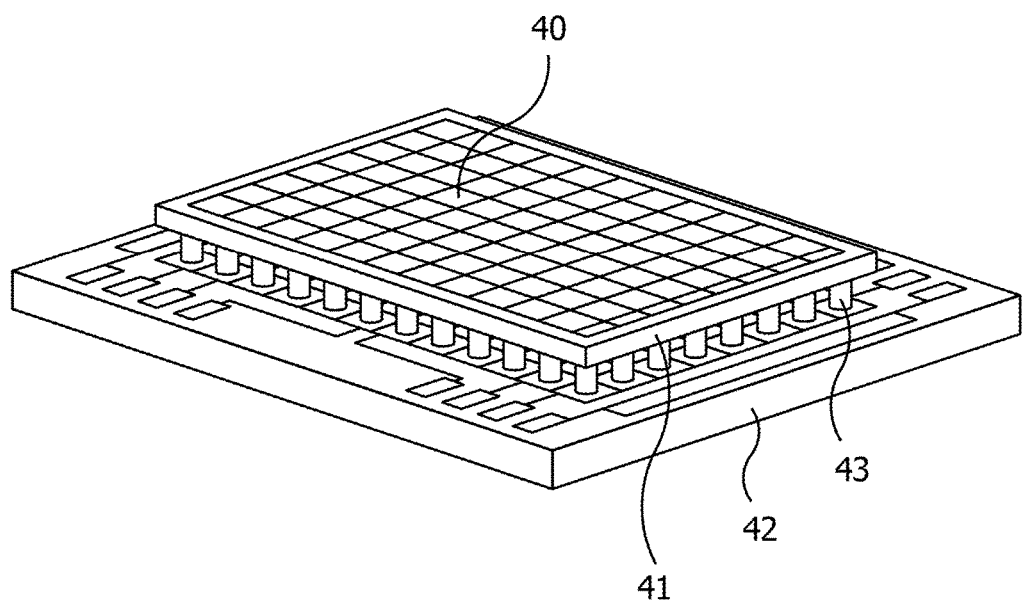
FIG. 10 is a perspective view illustrating a schematic configuration of an infrared imaging device according to a fourth embodiment.
Figure 11:
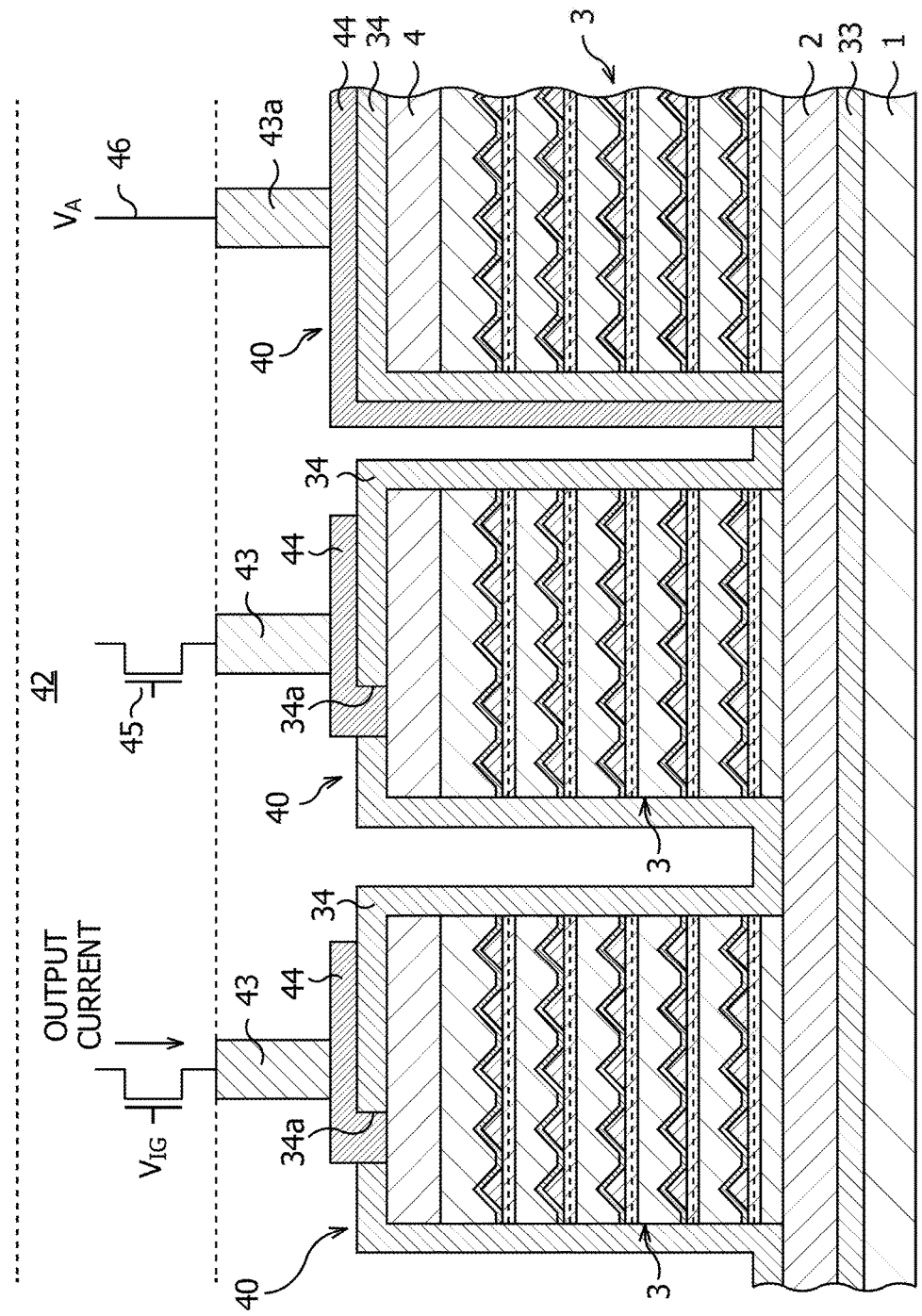
FIG. 11 is a schematic sectional view illustrating an enlarged part of the infrared imaging device according to the fourth embodiment.

FIG. 10 is a perspective view illustrating a schematic configuration of the infrared imaging device according to the fourth embodiment. FIG. 11 is a schematic sectional view illustrating an enlarged part of the infrared imaging device according to the fourth embodiment.

The infrared imaging device includes an infrared imaging panel 41 and a readout circuit 42, and the infrared imaging panel 41 and the readout circuit 42 are electrically connected to each other through a bump 43.

In the infrared imaging panel 41, one kind infrared detector selected from the first to the third embodiments, here, for example, a plurality of the infrared detectors 40 according to the first embodiment are disposed in a plane in a matrix shape. Each infrared detector 40 becomes a pixel. The GaAs substrate 1, for example, an etching stopper layer 33 of InGaP and the lower contact layer 2 in each infrared detector 40 are commonly used in the infrared imaging panel 41. A wiring 44 is formed on an insulator 34 of each infrared detector 40, and the bump 43 is formed on each wiring 44. A part of the bump 43 is used as a common electrode 43a of each infrared detector 40. An electrode 5 or 6 which is not illustrated is electrically connected to one end of each wiring 44 (through an opening 34a formed on the insulator 34, for example).

The readout circuit 42 is a driving unit of each infrared detector 40, and includes a plurality of transistors 45 and power supply lines 46 for applying a power supply voltage $V_A$. Each transistor 45 is electrically connected to the bump 43, and each power supply line 46 is electrically connected to the common electrode 43a. When the power supply voltage $V_A$ is applied, an output current flows to each infrared detector 40.

According to the embodiment, an infrared imaging device with high reliability including an infrared detector 40 with high reliability which is capable of reducing noise and improving a S/N ratio is realized.

Fifth Embodiment

Hereinafter, a fifth embodiment will be described. In the embodiment, an infrared imaging system including an infrared imaging device according to the fifth embodiment is disclosed.

Figure 12:
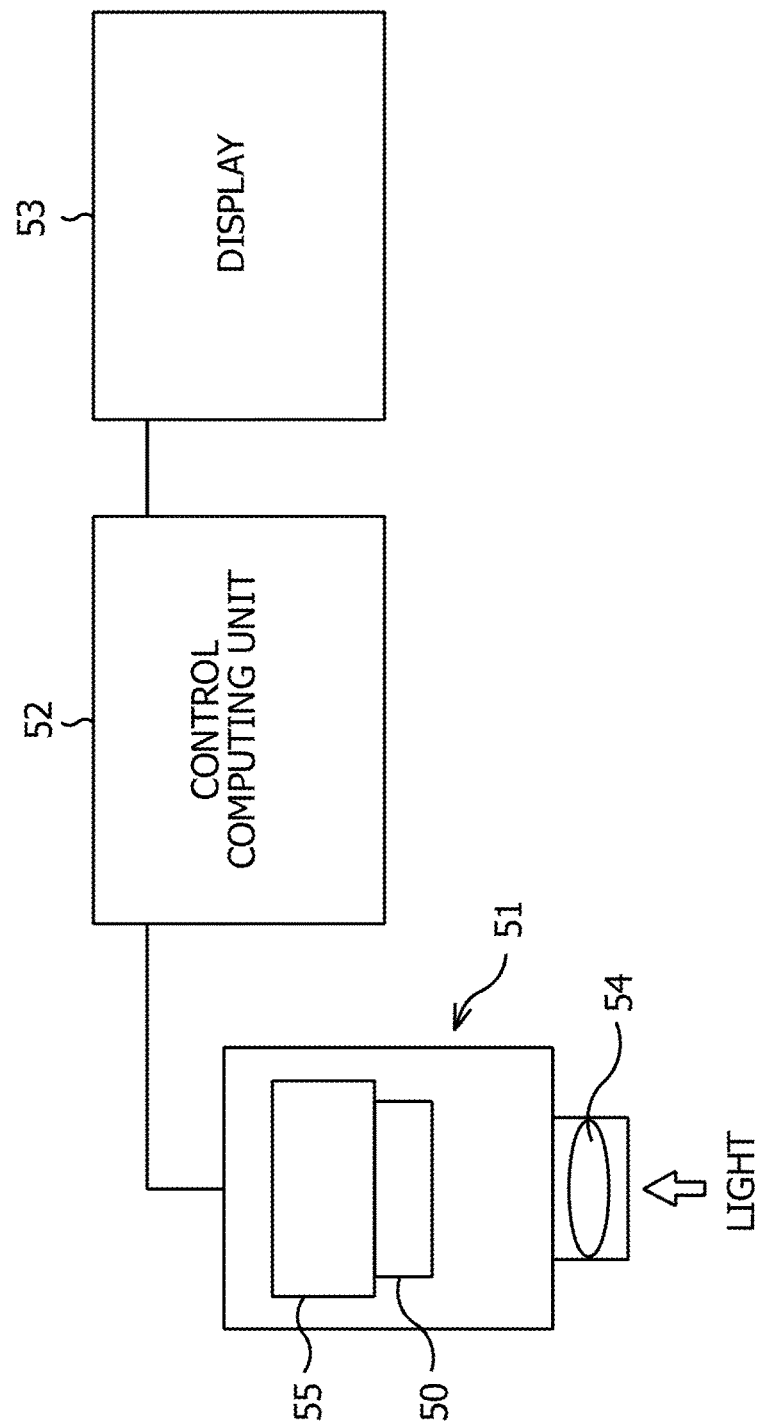
FIG. 12 is a schematic diagram illustrating a schematic configuration of an infrared imaging system according to a fifth embodiment.

FIG. 12 is a schematic diagram illustrating a schematic configuration of an infrared imaging system according to the fifth embodiment.

The infrared imaging system includes a sensor unit 51, a control calculation unit 52, and a display unit 53.

The sensor unit 51 includes a lens 54 collecting incident light, an infrared imaging device 50 according to the fourth embodiment, and a cooling unit 55 for cooling the infrared imaging device 50. The control calculation unit 52 controls the driving circuit 42 of the infrared imaging device 50. The display unit 53 displays an infrared image which is captured by the infrared imaging device 50 based on an image capturing signal transmitted from the control calculation unit 52.

According to the embodiment, an infrared imaging system with high reliability including an infrared detector 40 with high reliability which is capable of reducing noise and improving a S/N ratio is realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An infrared detector comprising:
a quantum dot structure; and
an electrode that is coupled to the quantum dot structure,
wherein the quantum dot structure is obtained by stacking a plurality of structures each including
a quantum dot,
a first barrier layer under the quantum dot and a second barrier layer over the quantum dot to cover the quantum dots, and
an intermediate layer under the first barrier layer, and
wherein the first barrier layer includes a first region and a second region having a lower Al concentration than that of the intermediate layer between the first region and the intermediate layer.
2. The infrared detector according to claim 1,
wherein the first region has a larger energy gap than that of the intermediate layer, and the second region has a smaller energy gap than that of the intermediate layer.
3. The infrared detector according to claim 1,
wherein the second region has $Al_aGa_{1-a}As$ (0≤a<1).
4. The infrared detector according to claim 1,
wherein the second region has $In_aGa_{1-a}P$ (0≤a≤1).
5. The infrared detector according to claim 3,
wherein the intermediate layer has $Al_bGa_{1-b}As$ (0<b≤1), and the first region has $Al_cGa_{1-c}As$ (0<c≤1), where b<c.
6. The infrared detector according to claim 5,
wherein the second barrier layer has $Al_dGa_{1-d}As$ (0<d≤1), where b<d.
7. The infrared detector according to claim 1,
wherein the second region has a mixed crystal of one kind or two or more kinds selected from the group consisting of GaAs, InAs, GaSb, InSb, GaP, and InP.
8. The infrared detector according to claim 1,
wherein the second barrier layer includes a third region and a fourth region having a lower Al concentration than that of the intermediate layer over an upper portion of the third region.
9. The infrared detector according to claim 1,
wherein the first region has a thickness of 2 nm or less.
10. An imaging device comprising:
a plurality of infrared detectors; and
a readout circuit that drives the infrared detectors,
wherein the infrared detector includes
a quantum dot structure, and
an electrode that is coupled to the quantum dot structure,
wherein the quantum dot structure is obtained by stacking a plurality of structures each including
a quantum dot,
a first barrier layer under the quantum dot and a second barrier layer over the quantum dot to cover the quantum dots, and
an intermediate layer under the first barrier layer, and
wherein the first barrier layer includes a first region and a second region having a lower Al concentration than that of the intermediate layer between the first region and the intermediate layer.
11. The imaging device according to claim 10,
wherein the second region has $Al_aGa_{1-a}As$ (0≤a<1).
12. The imaging device according to claim 10,
wherein the second region has $In_aGa_{1-a}P$ (0≤a≤1).
13. An imaging system comprising:
an infrared sensor assembly;
a controller that controls the infrared sensor unit; and
a display that displays a captured infrared image,
wherein the infrared sensor assembly includes
an infrared imaging device,
a cooler that cools the infrared imaging device, and
a lens for incident infrared rays to the infrared imaging device,
wherein the infrared imaging device includes
a plurality of infrared detectors, and
a readout that drives the infrared detectors,
wherein the infrared detector includes
a quantum dot structure, and
an electrode that is coupled to the quantum dot structure,
wherein the quantum dot structure is obtained by stacking a plurality of structures each including
a quantum dot,
a first barrier layer under the quantum dot and a second barrier layer over the quantum dot to cover the quantum dots, and
an intermediate layer under the first barrier layer, and
wherein the first barrier layer includes a first region and a second region having a lower Al concentration than that of the intermediate layer between the first region and the intermediate layer.
14. The imaging system according to claim 13,
wherein the second region has $Al_aGa_{1-a}As$ (0≤a<1).
15. The imaging system according to claim 13,
wherein the second region has $In_aGa_{1-a}P$ (0≤a≤1).

* * * * *